United States Patent
Feng

(10) Patent No.: US 10,412,844 B1
(45) Date of Patent: Sep. 10, 2019

(54) DISPLAY DEVICE

(71) Applicant: Shanghai Tianma Micro-Electronics Co., Ltd., Shanghai (CN)

(72) Inventor: Hebing Feng, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/231,335

(22) Filed: Dec. 21, 2018

(30) Foreign Application Priority Data

Apr. 28, 2018 (CN) .......................... 2018 1 0404511

(51) Int. Cl.
| H05K 5/00 | (2006.01) |
| H01L 51/52 | (2006.01) |
| H05K 5/02 | (2006.01) |
| H04M 1/04 | (2006.01) |

(52) U.S. Cl.
CPC ......... *H05K 5/0017* (2013.01); *H01L 51/524* (2013.01); *H05K 5/0217* (2013.01); *G06F 2200/1632* (2013.01); *H01L 2251/5338* (2013.01); *H04M 1/04* (2013.01); *H05K 5/0204* (2013.01)

(58) Field of Classification Search
CPC .. H05K 5/0017; H05K 5/0217; H05K 5/0204; H01L 51/524; H01L 2251/5338; H04M 1/04; G06F 2200/1632; G06F 1/166; G06F 1/1669; G06F 1/1632; G06F 1/1628; G06F 1/1633; G06F 1/1667
See application file for complete search history.

(56) References Cited

U.S. PATENT DOCUMENTS

| 8,952,254 | B2 * | 2/2015 | Yu .......................... A45C 11/00 174/66 |
| 9,144,279 | B2 * | 9/2015 | Venida ................... A45C 11/34 |
| 9,482,383 | B1 * | 11/2016 | Wei ........................ F16M 13/00 |
| 9,823,093 | B2 * | 11/2017 | Kauhaniemi .......... G01D 5/145 |
| 2010/0159997 | A1 * | 6/2010 | Wang .................... G06F 1/1626 455/566 |
| 2012/0013781 | A1 * | 1/2012 | Yamagiwa ............ G06F 1/1626 348/333.01 |
| 2013/0181098 | A1 * | 7/2013 | Lin ....................... F16M 11/105 248/122.1 |

(Continued)

FOREIGN PATENT DOCUMENTS

CN 106847117 A 6/2017

*Primary Examiner* — Abhishek M Rathod
(74) *Attorney, Agent, or Firm* — Anova Law Group, PLLC

(57) ABSTRACT

A display device is provided. The display device comprises: a flexible display panel; a shell capable of being folded, wherein the shell comprises a plate surface for carrying the flexible display panel, a clamping portion including a first slot, and a locking portion including a second slot; and a telescopic member retractable along a longitudinal direction of the telescopic member. In a first state of the display device, the telescopic member is stretched, a first end of the telescopic member is inserted into the first slot and a second end of the telescopic member is located outside the display device as a supporting point to support the display device. In a second state of the display device, the telescopic member is contracted, the first end of the telescopic member is inserted into the first slot, and the second end of the telescopic member is inserted into the second slot.

20 Claims, 14 Drawing Sheets

(56) References Cited

U.S. PATENT DOCUMENTS

| | | | | |
|---|---|---|---|---|
| 2013/0342976 A1* | 12/2013 | Chung | ............... | H05K 5/0234 |
| | | | | 361/679.01 |
| 2015/0108313 A1* | 4/2015 | Leung | ............... | H05K 5/0204 |
| | | | | 248/351 |
| 2016/0007441 A1* | 1/2016 | Matsueda | ............ | G06F 1/1652 |
| | | | | 361/749 |
| 2017/0336827 A1* | 11/2017 | Lukic | ............... | A63F 13/2145 |

* cited by examiner

DISPLAY DEVICE

CROSS-REFERENCES TO RELATED APPLICATIONS

This application claims the priority of Chinese patent application No. 201810404511.8, filed on Apr. 28, 2018, the entirety of which is incorporated herein by reference.

FIELD OF THE DISCLOSURE

The present disclosure generally relates to the field of display technologies and, more particularly, relates to a display device.

BACKGROUND

With the development of science and technology, portable devices as a new trend of development are gradually changing the living environment of human beings, and have brought major changes in science and technology.

Flexible display devices are deformable and bendable, and mainly include a rolled type, a folded type, and an extended type, etc. However, existing flexible display devices have to be supported by an external supporting device during an operation, which has a complex structure. Thus, existing flexible display devices are inconvenient to operate and carry. In addition, existing flexible display devices often have a single display mode, which may be unable to bring users multiple new viewing experience.

Therefore, it has become an urgent technical problem to conveniently operate and carry a flexible display device while realizing a variety of display functions. The disclosed display device is directed to solve one or more problems set forth above and other problems in the art.

BRIEF SUMMARY OF THE DISCLOSURE

One aspect of the present disclosure provides a display device. The display device comprises: a flexible display panel; a shell capable of being folded, wherein the shell comprises a plate surface for carrying the flexible display panel, a clamping portion including a first slot, and a locking portion including a second slot; and a telescopic member retractable along a longitudinal direction of the telescopic member. In a first state of the display device, the telescopic member is stretched, and an extending direction of the telescopic member intersects a plane where the plate surface is located, a first end of the telescopic member is inserted into the first slot and a second end of the telescopic member is located outside the display device as a supporting point to support the display device. In a second state of the display device, the shell is folded in half along a folding line and divided into a first shell portion and a second shell portion by the folding line, the first shell portion and the second shell portion are at least partially overlapped with each other along a thickness direction of the first shell portion, the clamping portion is located in the first shell portion, the locking portion is located in the second shell portion, the telescopic member is contracted, the first end of the telescopic member is inserted into the first slot, and the second end of the telescopic member is inserted into the second slot.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
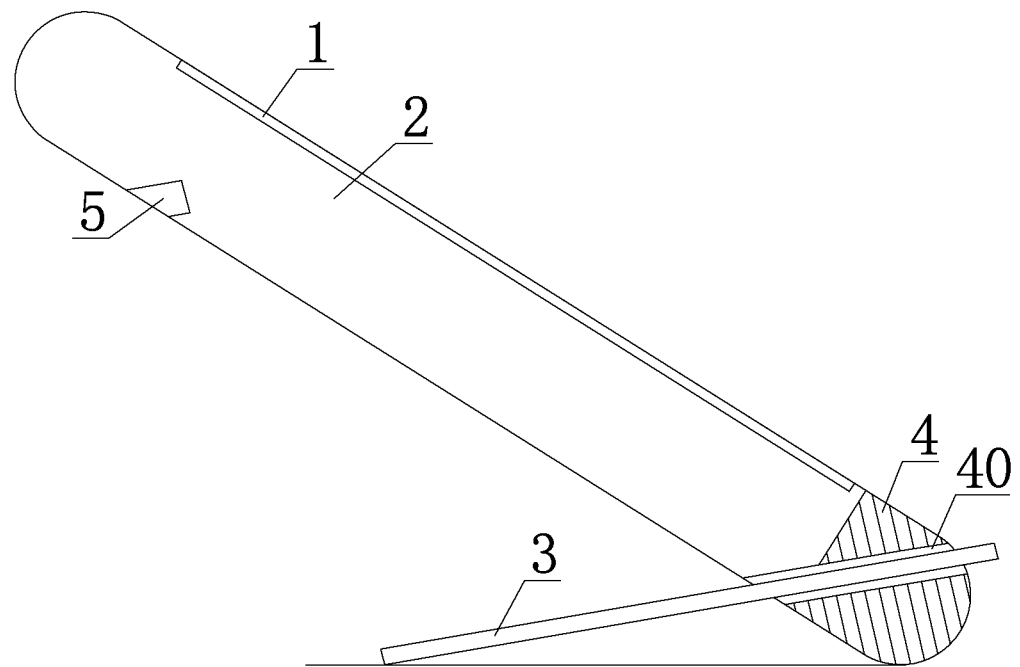
FIG. 1 illustrates a first state of a display device according to an embodiment of the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

FIG. 1 illustrates a first state of a display device according to an embodiment of the present disclosure. As shown in FIG. 1, the display device may include: a flexible display panel 1, a shell 2, and a telescopic/retractable member 3. The shell 2 may be a foldable shell, and may include a plate surface for carrying the flexible display panel 1. The telescopic member 3 may be retractable along the longitudinal direction of the telescopic member 3. The shell 2 may include a clamping portion 4, and the clamping portion 4 may include a first slot 40.

In the first state of the display device shown in FIG. 1, the telescopic member 3 may be in a stretched state, and the extension/stretching direction of the telescopic member 3 may intersect a plane where the plate surface is located. The first end of the telescopic member 3 may be inserted into the first slot 40, and the second end of the telescopic member 3 may be located outside the display device as a supporting point to support the display device. The shell 2 also may include a locking portion, and the locking portion may include a second slot 5.

Figure 2:
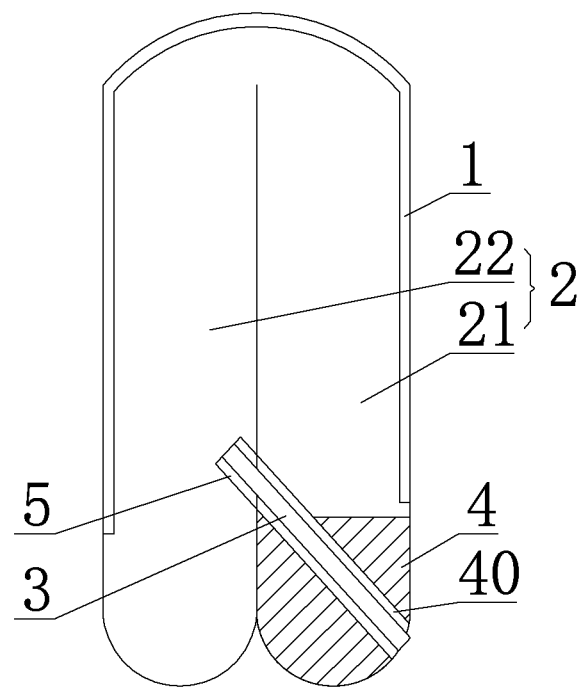
FIG. 2 illustrates a second state of the display device shown in FIG. 1.

FIG. 2 illustrates a second state of the display device shown in FIG. 1. As shown in FIG. 2, the shell 2 may be folded in half along a folding line and may be divided into a first shell portion 21 and a second shell portion 22 by the folding line. The first shell portion 21 and the second shell portion 22 may at least partially overlap with each other in the thickness direction of the first shell portion 21. The clamping portion 4 may be located in the first shell portion 21, and the locking portion may be located in the second shell portion 22. In the second stage of the display device, the telescopic member 3 may be in a contracted state, in which the first end of the telescopic member 3 may be inserted into the first slot 40 and the second end of the telescopic member 3 may be inserted into the second slot 5.

In one embodiment, the flexible display panel 1 may be an organic light-emitting display panel, which may be capable of displaying multi-screen images, etc. The foldable shell 2 may be convenient to carry after being folded, and the folding modes may include a forward folding and a backward folding. The shell 2 may have a first side facing or close to the flexible display panel 1, and a second side far away from the flexible display panel 1. In the forward folding, the shell 2 may be folded toward the first side of the shell 2, and in the backward folding, the shell 2 may be folded toward the second side of the shell 2. In another embodiment, the flexible display panel 1 may be any appropriate flexible display panels, which is not limited by the present disclosure.

In one embodiment, when the shell 2 is configured in the first state, i.e., the unfolded state, the display device may be placed upright via the telescopic member 3 on a supporting surface (for example, table top, floor, etc.) for placing a display device. The plate surfaces of the first shell portion 21 and the second shell portion 22 may be located on the same plane, and the angle formed between the plate surface and the supporting surface may be greater than 0°, such that the flexible display panel 1 may be unfolded and standing on the supporting surface. At least one side of the display device may be in contact with the supporting surface, and the second end of the telescopic member 3 may be located outside the display device as a supporting point. The supporting point may be in contact with the supporting surface on which the display device is placed, thereby supporting the display device.

In another embodiment, when the display device is placed upright, the shell 2 may be configured in the second state, i.e., the folded state. Taking the backward folding of the shell 2 as an example, the shell 2 may be folded in half toward the second side of the shell 2 (i.e., the side facing away from the flexible display panel 1), such that the display device may realize as a double-sided display. The display device with the double-sided display may be placed vertically via the telescopic member 3, thereby enabling the user to watch images on both sides of the display device in a convenient way.

Further, the shell 2 may be made of at least one of metal, resin or rubber. The telescopic member 3 may be made of at least one of metal, resin, or rubber, and the clamping portion 4 may be made of at least one of metal, resin, or rubber. In the disclosed embodiments, the shell 2, the telescopic member 3, and the clamping portion 4 may be made of the same material or different materials, so as to ensure the stability and buffering performance of the telescopic member 3 for supporting the shell 2 and reduce the influence on the flexible display panel 1.

In the disclosed embodiments, the top and the bottom of the shell 2 may be curved to provide improved user experience, and the details will not be described here.

In the disclosed embodiments, the telescopic member 3 may be stretched and contracted along the longitudinal direction of the telescopic member 3, thereby satisfying the demands for configuring the display device in the first state or the second state. In particular, when the display device is configured in the first state, as shown in FIG. 1, the telescopic member 3 may be inserted into the first slot 40 and stretched along the longitudinal direction of the telescopic member 3. The shell 2 may be supported by the elongated/stretched telescopic member 3, thereby facilitating the users to view the images displayed by the flexible display panel 1.

When the display device is configured in the second state, as shown in FIG. 2, taking the backward folding of the shell 2 as an example, the shell 2 may be folded on the second side of the shell 2 (i.e., the side facing away from the flexible display panel 1). The second slot 5 may be connected with the first slot 40, and the telescopic member 3 may be contracted along the longitudinal direction of the telescopic member 3, such that the first end of the telescopic member 3 may be inserted into the first slot 40, and the second end of the telescopic member 3 may be inserted into the second slot 5.

Thus, in the disclosed embodiments, through providing the telescopic member 3 in the display device, the display device may be able to realize both the supporting function of the display device in the first state and the locking function in the second state, and the users may be able to freely switch the operation states of the display device according to demands, thereby facilitating the device operation and carry. The telescopic member 3 may integrate the supporting and locking functions, and have good stability to support the display device and simple structure, which may reduce the fabrication cost and simplify the fabrication process.

The shell 2 may be provided with a baffle/blocking plate corresponding to the first slot 40. The blocking plate may be a square blocking plate or a circular blocking plate, covering the outer port of the first slot 40 to prevent the telescopic member 3 from sliding out from the first slot 40.

In certain embodiments, when the telescopic member 3 is configured in the stretched state, the telescopic member 3 may have a plate or a rod shape, which may be configured to support the display device and facilitate the shell 2 to be folded and stored in the first slot 40 and the second slot 5. Corresponding structures are shown in FIGS. 3-4.

Figure 3:
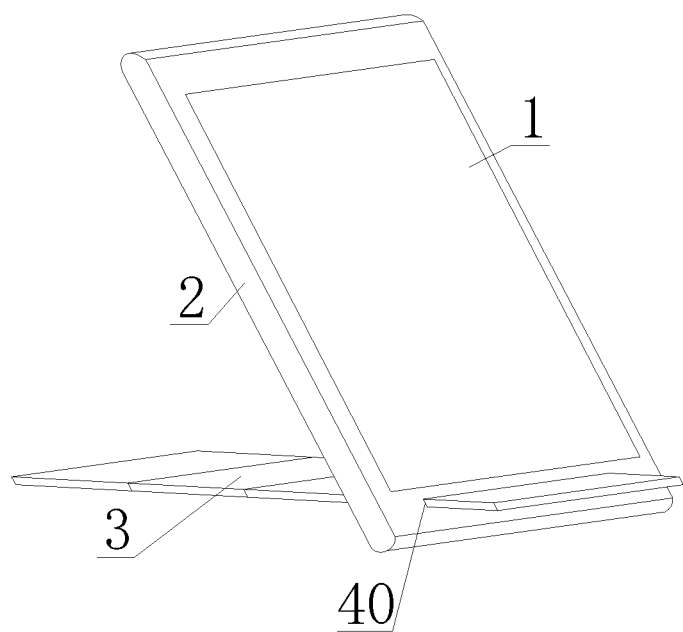
FIG. 3 illustrates a schematic diagram of a telescopic plate for supporting a shell in the display device shown in FIG. 1.

FIG. 3 illustrates a schematic diagram of the telescopic plate for supporting a shell 2. In the disclosed embodiments, as shown in FIG. 3, when the telescopic member 3 is configured in the stretched state, the telescopic member 3 may be in a plate shape. In one embodiment, the telescopic member having the plate shape may be a telescopic flat plate, the first side of the telescopic flat plate may be inserted into the first slot 40, and the second side of the telescopic flat plate may be located outside the display device as a support. The telescopic flat plate may be stretched and contracted along a direction intersecting the first side of the telescopic flat plate.

Figure 4:
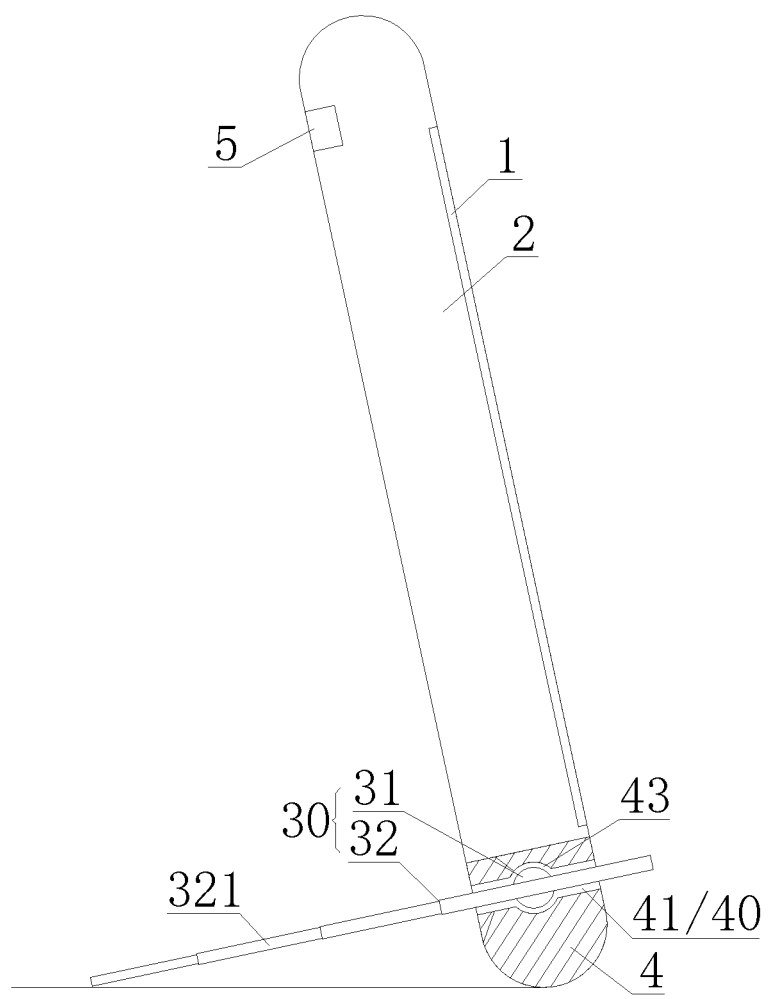
FIG. 4 illustrates a schematic cross-sectional view of another display device according to an embodiment of the present disclosure.

FIG. 4 illustrates a schematic cross-sectional view of another display device provided by an embodiment of the present disclosure. As shown in FIG. 4, the telescopic member 3 may be a rod 30. The first slot 40 may include a first through-slot 41, and the first through-slot 41 penetrates through the clamping portion 4 along the direction intersecting the plane of the plate surface. The rod 30 may be inserted into the first through-slot 41, and the two ends of the rod 30 may be located on the opposite sides of the shell 2. The rod 30 may move along the extending direction of the first through-slot 41. In the disclosed embodiments, the rod 30 may not only reduce the overall weight of the display device, but also effectively ensure the rigidity of the shell 2, which may further facilitate the telescopic operation of the rod 30 and the folding and carrying of the shell 2.

As shown in FIG. 4, the rod 30 may include a mandrel 31 and a telescopic shaft 32 penetrating the mandrel 31. The mandrel 31 may be a sphere. The first slot 40 may include a spherical groove 43 which may accommodate the mandrel 31. The telescopic shaft 32 and the mandrel 31 may move relative to each other along the telescopic direction of the telescopic shaft 32. The telescopic shaft 32 and the mandrel 31 may be interlocked/linked in the rotational direction about an axis of the telescopic shaft 32 in which the axis of the telescopic shaft 32 may be a rotating axis, and the telescopic shaft 32 and the mandrel 31 may rotate around the rotating axis. In the disclosed embodiments, the mandrel 31 may rotate within the spherical groove 43, and the telescopic shaft 32 may rotate in the first through-slot 41 with the center of the spherical mandrel 31 as a rotating center, thereby assisting the adjustment of the supporting position of the telescopic shaft 32.

As shown in FIG. 4, the telescopic shaft 32 may include at least N sub-tubes 321 sequentially arranged as the first sub-tube to the N-th sub-tube. The inner diameter of the X-th sub-tube may be larger than the outer diameter of the (X+1)-th sub-tube. When the rod 30 is in the contracted state, the (X+1)-th sub-tube may be accommodated in the X-th sub-tube, where both X and N are positive integers, and N≥2 and 1≤X≤N−1. In the disclosed embodiments, the telescopic shaft 32 may be telescopic/retractable in the longitudinal direction of the telescopic shaft 32, and the inner diameters of the N-th sub-tubes 321 may sequentially decrease along the direction from the X-th sub-tube to the (X+1)-th sub-tube. Thus, the (X+1)-th sub-tube may be sequentially accommodated in the adjacent X-th sub-tube with a larger inner diameter and, accordingly, the telescopic shaft 32 may be conveniently accommodated in the shell 2 for carrying.

Figure 5:
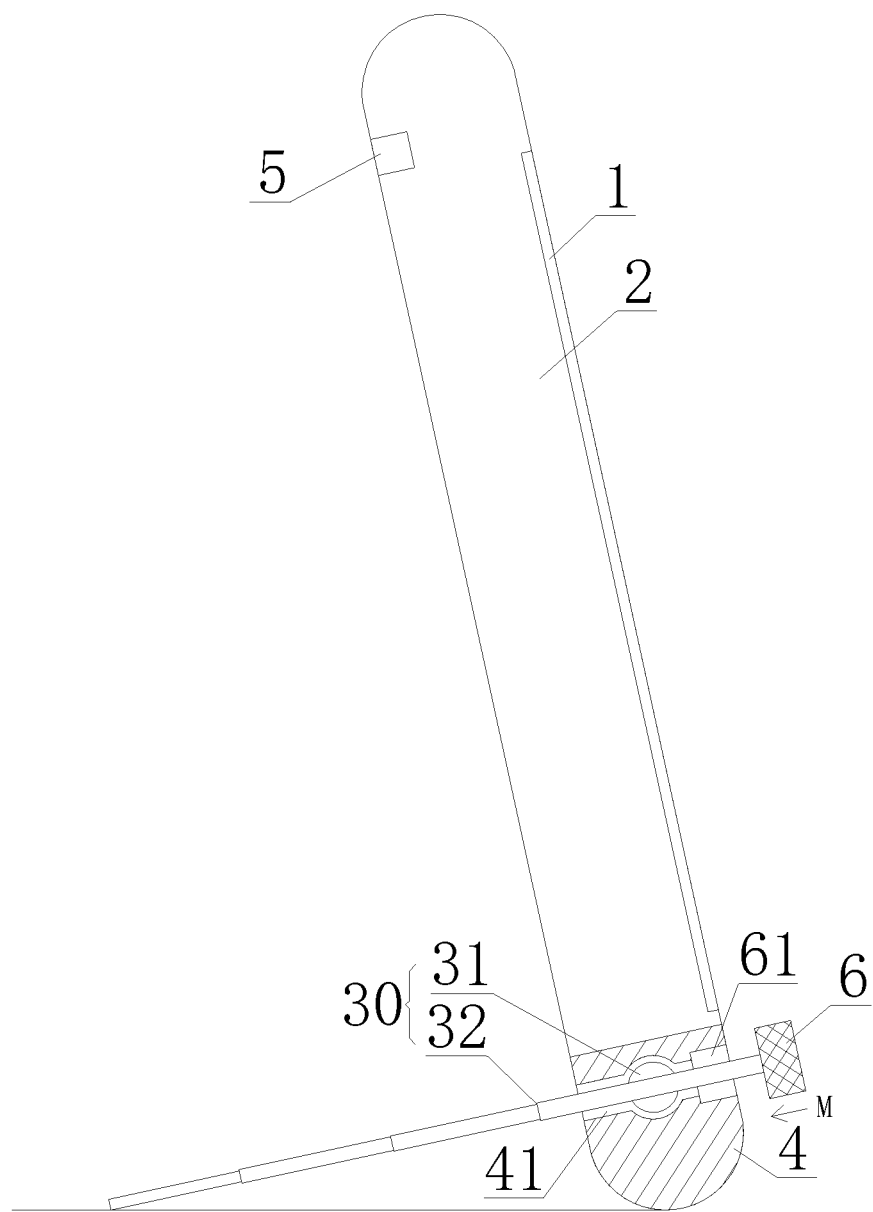
FIG. 5 illustrates a first state of another display device according to an embodiment of the present disclosure.
Figure 6:
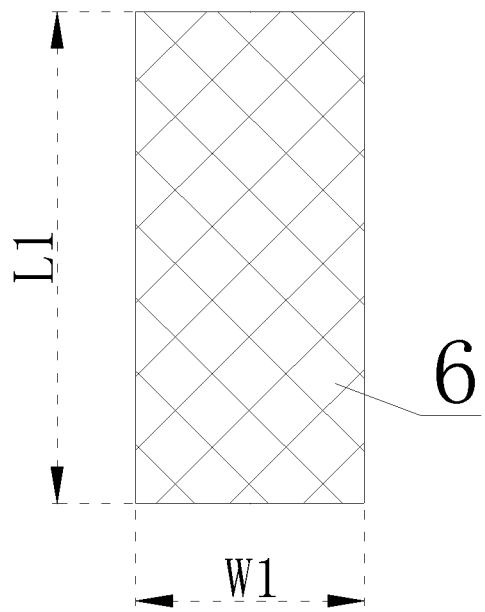
FIG. 6 illustrates a schematic cross-sectional view of a first fixing portion in the display device shown in FIG. 5.
Figure 7:
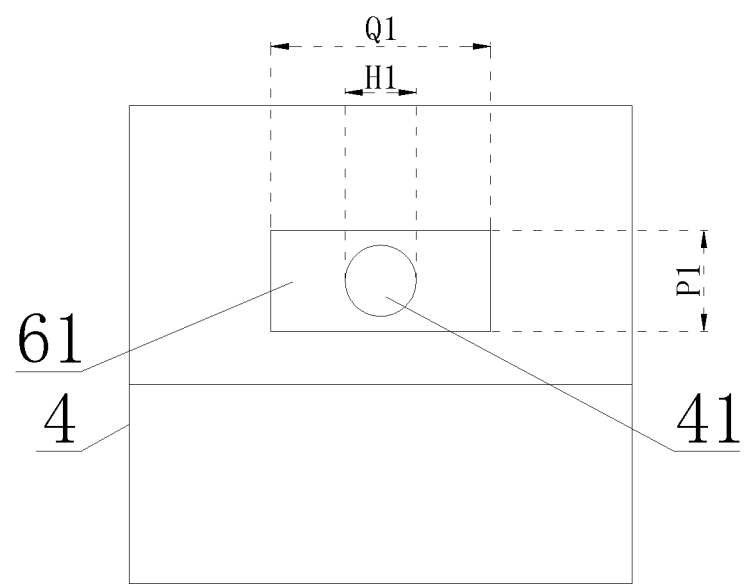
FIG. 7 illustrates an M-sectional view of a clamp portion in the display device shown in FIG. 5.

FIG. 5 illustrates a first state of another display device according to an embodiment of the present disclosure. FIG. 6 illustrates a schematic cross-sectional view of a first fixing portion in the display device shown in FIG. 5. FIG. 7 illustrates an M-sectional view of a clamp portion in the display device shown in FIG. 5.

As shown in FIGS. 5-7, the first end of the rod 30 may include a first fixing portion 6, and the cross-section of the first fixing portion 6 may have a first pattern. The cross-section of the first fixing portion 6 may be perpendicular to the extending direction of the rod 30. The length of the first pattern is L1, and the width of the first pattern is W1. The clamping portion 4 may include a first accommodating chamber 61 for accommodating the first fixing portion 6. The first through-slot 41 has a first end close to a surface of the shell (the surface facing the viewers) and an opposite second end far away from the surface of the shell, and the first accommodating chamber 61 may be located at the first end of the first through-slot 41. The first accommodating chamber 61 may be connected with the first through-slot 41. The length of the first through-slot 41 is H1, the length of the first accommodating chamber 61 is Q1, and the width of the first accommodating chamber 61 is P1, where Q1>L1>P1>W1>H1, and Q1, P1 and H1 are dimensions in a plane parallel to the first pattern.

In the disclosed embodiments, the rod 30 may include the mandrel 31 and the telescopic shaft 32 penetrating the mandrel 31. Because Q1>L1>P1>W1>H1 (i.e., the length Q1 of the first accommodating chamber 61>the length L1 of the first pattern>the width P1 of the first accommodating chamber 61>the width W1 of the first pattern>the length H1 of the first through-slot 41), when the telescopic shaft 32 is retracted in the first through-slot 41, even when the rod 30 is rotated to have the longitudinal direction of the first pattern parallel to the longitudinal direction of the first accommodating chamber 61, the first fixing portion 6 may not move into the first through-slot 41.

In addition, because Q1>L1>P1>W1 (i.e., the length Q1 of the first accommodating chamber 61>the length L1 of the first pattern>the width P1 of the first accommodating chamber 61>the width W1 of the first pattern), the first fixing portion 6 may be accommodated in the first accommodating chamber 61 when the display device is in the first state. The ratio between the length L1 of the first pattern and the width W1 of the first pattern L1/W1 may be in a range of 1.1≤L1/W1≤3.

Figure 8:
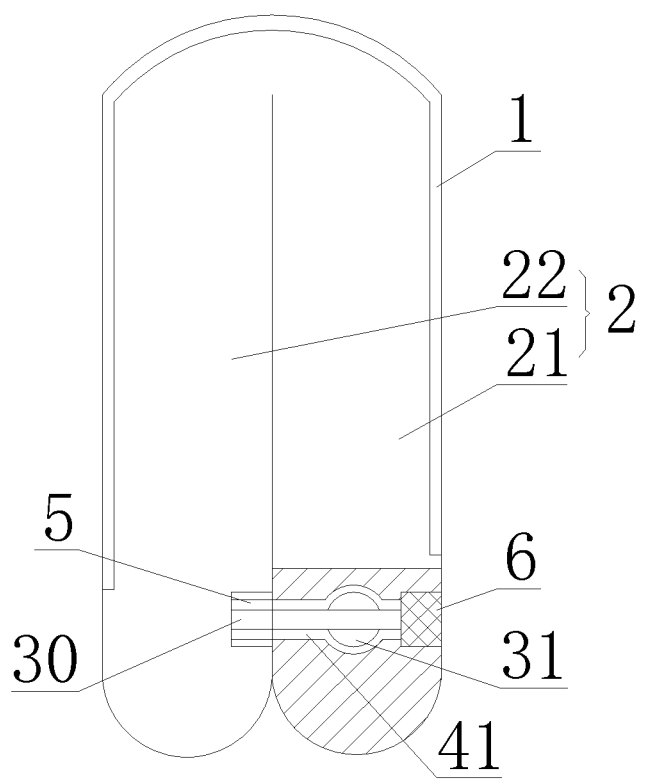
FIG. 8 illustrates a second state of the display device shown in FIG. 5.

FIG. 8 illustrates a second state of the display device shown in FIG. 5. Taking the backward folding of the shell 2 as an example, the shell 2 may be divided into a first shell portion 21 and a second shell portion 22 by a folding line. When the display device is in the second state, the first pattern may rotate about the straight line where the rod 30 is located. That is, the rod 30 may be rotated, such that the longitudinal direction of the first pattern may be parallel to the longitudinal direction of the first accommodating chamber 61, the first fixing portion 6 may be pushed into the first accommodating chamber 61, enabling the first fixing portion 6 to be accommodated in the first accommodating chamber 61. Then the first end of the rod 30 may be contracted and accommodated in the first through-slot 41 and, meanwhile, the first fixing portion 6 may be accommodated in the first accommodating chamber 61, the second end of the rod 30 may be accommodated in the second slot 5. Thus, the first shell portion 21 and the second shell portion 22 may be locked.

In one embodiment, the first pattern may be a rectangle, and the first fixing portion 6 may be a cuboid, and the first accommodating chamber 61 may be a cuboid groove with an opening located on one surface of the clamping portion 4.

Because Q1>L1>P1>W1>H1, the cuboid first fixing portion 6 may be accommodated in the first accommodating chamber 61, and the first fixing portion 6 may be stuck outside the first through-slot 41. Thus, the first end of the rod 30 may be unable to penetrate through the first through-slot 41 and the rod 30 may not be detached from the clamping portion 4. In another embodiment, the first pattern may be a rounded rectangle, a quadrangle, such as a trapezoid, a parallelogram, and a diamond, etc.

In one embodiment, the thickness of the first fixing portion 6 (e.g., the height of the cuboid fixing portion 6) may be less than or equal to the thickness of the first accommodating chamber 61 (e.g., the depth of the first accommodating chamber 61 in a cuboid groove), where the depth direction may be a direction perpendicular to the thickness of the plate surface of the shell 2 or a direction parallel to the telescopic/retractable direction of the rod 30.

Through configuring the first fixing portion 6, the first end of the rod 30 may be stuck outside of the first through-slot 41, and the rod 30 may not be detach from the clamping portion 4. Through configuring the first accommodating chamber 61 to accommodate the first fixing portion 6, the first accommodating chamber 61 may be an opening located on one surface of the clamping portion 4. That is, the first accommodating chamber 61 may be located inside the clamping portion 4, thereby reducing the weight of the clamping portion 4 without degrading the appearance of the shell 2.

Meanwhile, the first fixing portion 6 may be accommodated in the first accommodating chamber 61 after the rod 30 is contracted, which may not degrade the appearance of the shell 2. When the display device is configured in the first state, the first fixing portion 6 is stuck outside the first through-slot 41, which may further facilitate the users to stretch the rod 30 to support the display device.

Figure 9:
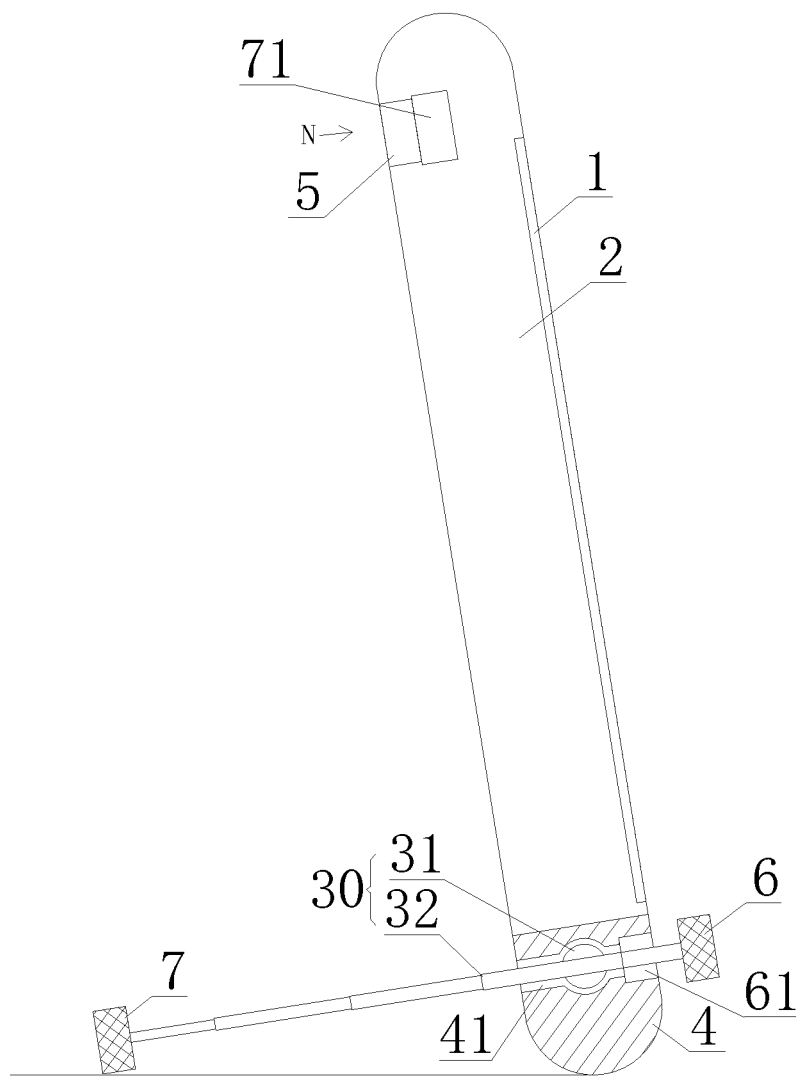
FIG. 9 illustrates a first state of another display device according to an embodiment of the present disclosure.
Figure 10:
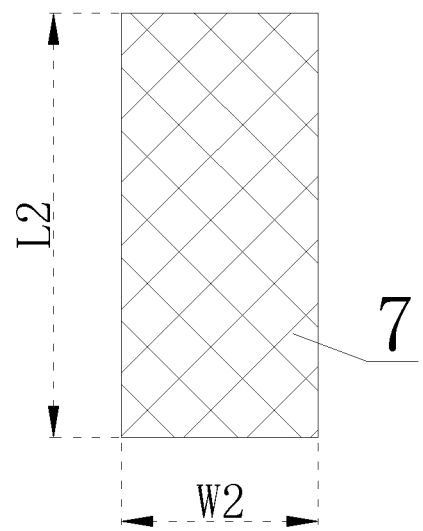
FIG. 10 illustrates a schematic cross-sectional view of a second fixing portion in the display device shown in FIG. 9.
Figure 11:
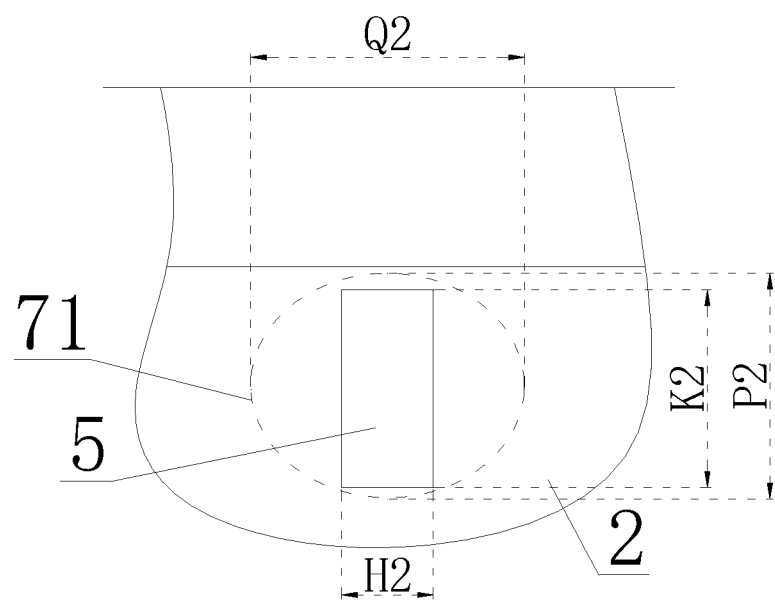
FIG. 11 illustrates a schematic diagram of a locking portion along an N direction in the display device shown in FIG. 9.

FIG. 9 illustrates a first state of another display device according to an embodiment of the present disclosure. FIG. 10 illustrates a schematic cross-sectional view of a second fixing portion in the display device shown in FIG. 9. FIG. 11 illustrates a schematic diagram of a locking portion along an N direction in the display device shown in FIG. 9. For ease of description, FIG. 11 only illustrates a portion of the shell 2.

As shown in FIGS. 9-11, the second end of the rod 30 may include a second fixing portion 7. The cross-section of the second fixing portion 7 may have a second pattern, and the cross-section of the second fixing portion 7 may be perpendicular to the extending direction of the rod 30. The length of the second pattern is L2, and the width of the second pattern is W2. The locking portion may further include a second accommodating chamber 71 for accommodating the second fixing portion 7. The second slot may have a first end close to the clamping portion 4 and an opposing second end far away from the clamping portion 4, and the second accommodating chamber 71 may be located at the second end of the second slot 5 (i.e., the end far away from the clamping portion 4). The second accommodating chamber 71 and the second slot 5 may be interconnected with each other. The length of the second slot 5 is K2, and the width of the second slot is H2, where K2>L2>H2>W2. The length of the second accommodating chamber 71 is Q2, and the width of the second accommodating chamber 71 is P2, where Q2>L2 and P2>L2, and Q2 P2, K2 and are dimensions in a plane parallel to the second pattern.

In the disclosed embodiments, the rod 30 may include a mandrel 31 and a telescopic shaft 32 penetrating through the mandrel 31. The first end of the rod 30 may include a first fixing portion 6 and the second end of the rod 30 may include a second fixing portion 7. When the display device is in the first state, the display device may be supported on the supporting surface by the second fixing portion 7 and at least one side of the display device serving as two supporting points. The length of the second fixing portion 7 may be larger than the diameter of the telescopic shaft 32, such that the telescopic shaft 32 may be freely moving in the second slot 5, and the second fixing portion 7 may be stuck inside the second accommodating chamber 71.

Thus, when the display device is in the second state, the first shell portion 21 and the second shell portion 22 may be locked through the second fixing portion 7, and when the display device is in the first state, the longitudinal direction of the second fixing portion 7 may be configured to be parallel to the supporting surface that supports the display device. Thus, in the first state, the contact area between the second fixing portion 7 and the supporting surface that supports the display device may be increased, and the friction between the second fixing portion 7 and the supporting surface that supports the display device may be enhanced.

In one embodiment, the surface of the second fixing portion 7 may be rougher than the surface of the telescopic shaft 32, or the surface of the second fixing portion 7 may have a greater coefficient of surface friction than the surface of the telescopic shaft 32, thereby increasing the contact area between the second fixing portion 7 and the supporting surface that supports the display device, as well as the the friction between the second fixing portion 7 and the supporting surface that supports the display device.

In one embodiment, the material hardness of the second fixing portion 7 may be smaller than the material hardness of the telescopic shaft 32. The telescopic shaft 32 may be fabricated by a material of large material hardness and, thus, the supporting stability of the display device in the first state may be improved. Meanwhile, the second fixing portion 7 may fabricated by a material of strong elasticity, certain buffering function may be introduced at the supporting point. Accordingly, the pressure at the supporting point may be reduced, and the wear resistance and impact resistance of the display device at the supporting point may be improved.

Figure 12:
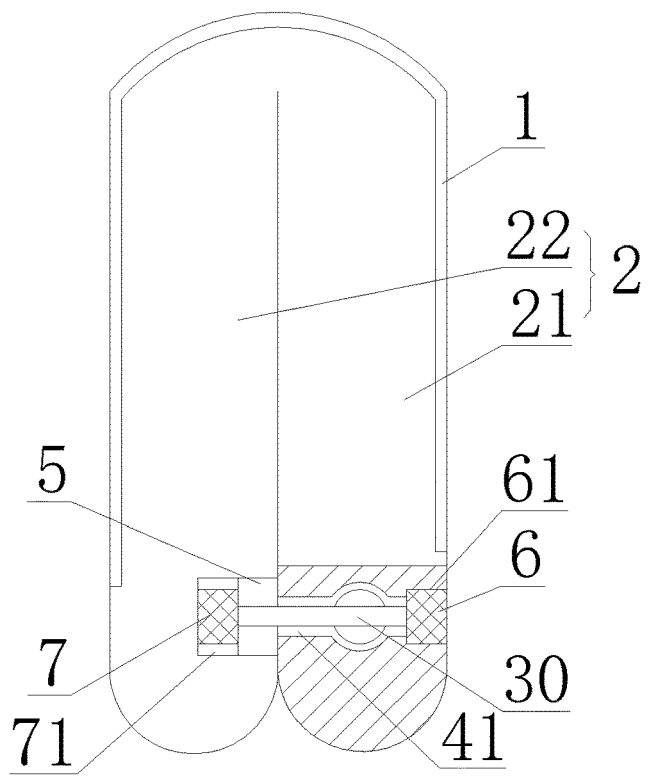
FIG. 12 illustrates a second state of the display device shown in FIG. 9.

FIG. 12 illustrates a second state of the display device shown in FIG. 9. Taking the backward folding of the shell 2 as an example, the shell 2 may be divided into a first shell portion 21 and a second shell portion 22 by the folding line. In FIG. 12, the display device may be in the second state, the second fixing portion 7 may sequentially enter the second slot 5 and the second accommodating chamber 71 by pushing the rod 30, thereby enabling the second fixing portion 7 to be accommodated in the second accommodating chamber 71. The rod 30 may be rotated to have the longitudinal direction of the second pattern parallel to the width direction of the second slot 5.

Because Q2>L2>H2>W2 (i.e., the length Q2 of the second accommodating chamber 71>the length L2 of the second pattern>the length H2 of the second slot 5>the width W2 of the second pattern), and P2>L2 (i.e., the width P2 of the second accommodating chamber 71>the length L2 of the second pattern), after rotating the rod 30 to configure the longitudinal direction of the second pattern to be parallel to the longitudinal direction of the second accommodating chamber 71, the second fixing portion 7 may be smoothly pushed into and stuck inside the second accommodating chamber 71 without sliding into the second slot 5. Meanwhile, the first fixing portion 6 may be accommodated in the first accommodating chamber 61, thereby locking the first shell portion 21 and the second shell portion 22. The ratio between the length L2 of the second pattern and the width W2 of the second pattern L2/W2 may be in a range of 1.1≤L2/W2≤3.

In the disclosed embodiments, through configuring the second fixing portion 7, when the display device may be in the first state, the contact area between the second end of the rod 30 and the supporting surface for supporting the display device may be increased, and the supporting stability may be enhanced. Through configuring the second accommodating chamber 71 to accommodate the second fixing portion 7, the second accommodating chamber 71 may be located at the second end of the second slot 5 (i.e., the end far away from the clamping portion 4), which may reduce the weight of the shell 2 without affecting the appearance of the shell 2.

When the display device is in the second state, the rod 30 may be contracted, and the second fixing portion 7 may be accommodated in the second accommodating chamber 71, which may not degrade the appearance of the shell 2. After rotating the rod 30 to configure the longitudinal direction of the second pattern to be parallel to the longitudinal direction of the second accommodating chamber 71, the second fixing portion 7 may be stuck inside the second accommodating chamber 71, and the first shell portion 21 and the second shell portion 22 may be locked, thereby facilitating the carrying of the display device by the user.

Figure 13:
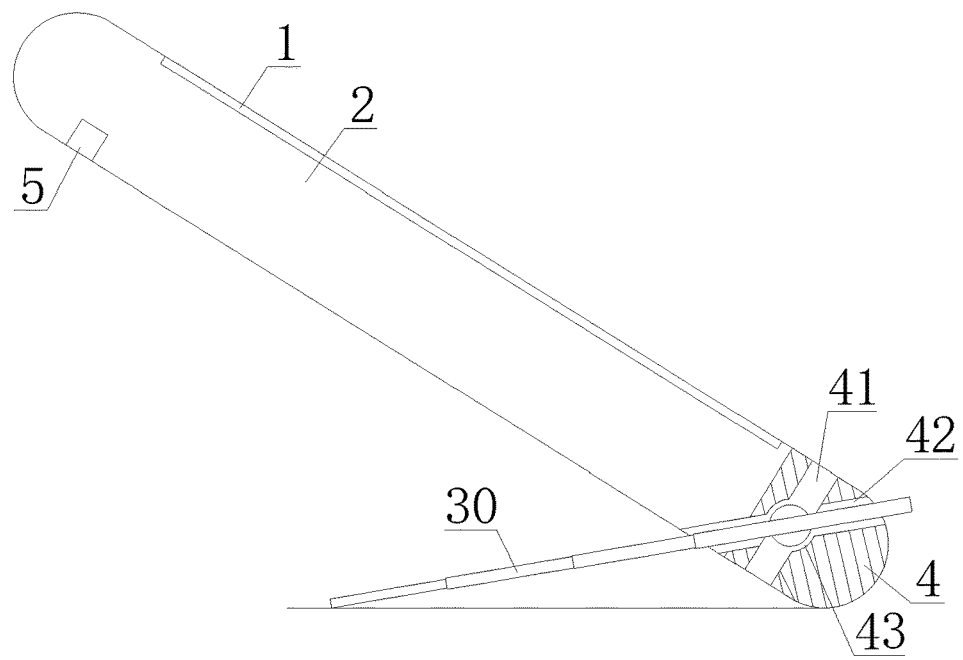
FIG. 13 illustrates a schematic cross-sectional view of another display device according to an embodiment of the present disclosure.
Figure 14:
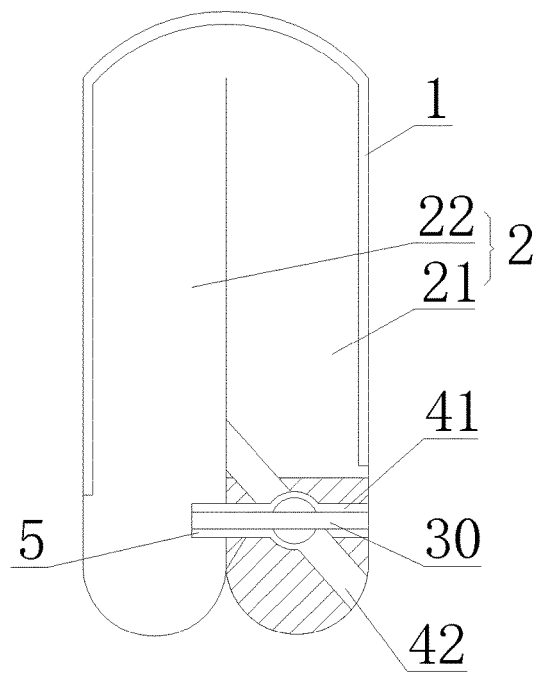
FIG. 14 illustrates a second state of the display device shown in FIG. 13.

FIG. 13 illustrates a schematic cross-sectional view of another display device according to an embodiment of the present disclosure, and FIG. 14 illustrates a second state of the display device shown in FIG. 13.

As shown in FIGS. 13-14, the first slot 40 may further include at least one second through-slot 42 which may penetrate through the shell 2 along a direction intersecting the plate surface. The extending direction of the second through-slot 42 may intersect the extending direction of the first through-slot 41, and the second through-slot 42 and the first through-slot 41 may intersect each other at the spherical groove 43. The second through-slot 42 and the first through-slot 41 may be interconnected with each other.

In the disclosed embodiments, the telescopic rod 30 may be located in the first through-slot 41 or the second through-slot 42, however, the structure of the second slot 5 may be desired to be adjusted accordingly, to ensure that the second end of the rod 30 is able to be accommodated in the second slot 5 after the shell 2 is folded.

In one embodiment, as shown in FIG. 13, the display device may be in the first state, and the rod 30 may be located in the second through-slot 42. As shown in FIG. 14, the display device may be in the second state, and the rod 30 may be located in the first through-slot 41.

Thus, when the display device may be in the first state, the rod 30 may be positioned in the second through-slot 42 to support the display device. When the display device may be in the second state, for example, when the shell 2 is backward folded, the shell 2 may be divided into a first shell portion 21 and a second shell portion 22 by the folding line. The first end of the rod 30 may be inserted into the first through-slot 41, and the second end of the rod 30 may be inserted into the second slot 5. The rod 30 may be in a contracted state, thereby locking the first shell portion 21 and the second shell portion 22. The folding and unfolding operations of the display device may be more flexible and convenient.

Figure 15:
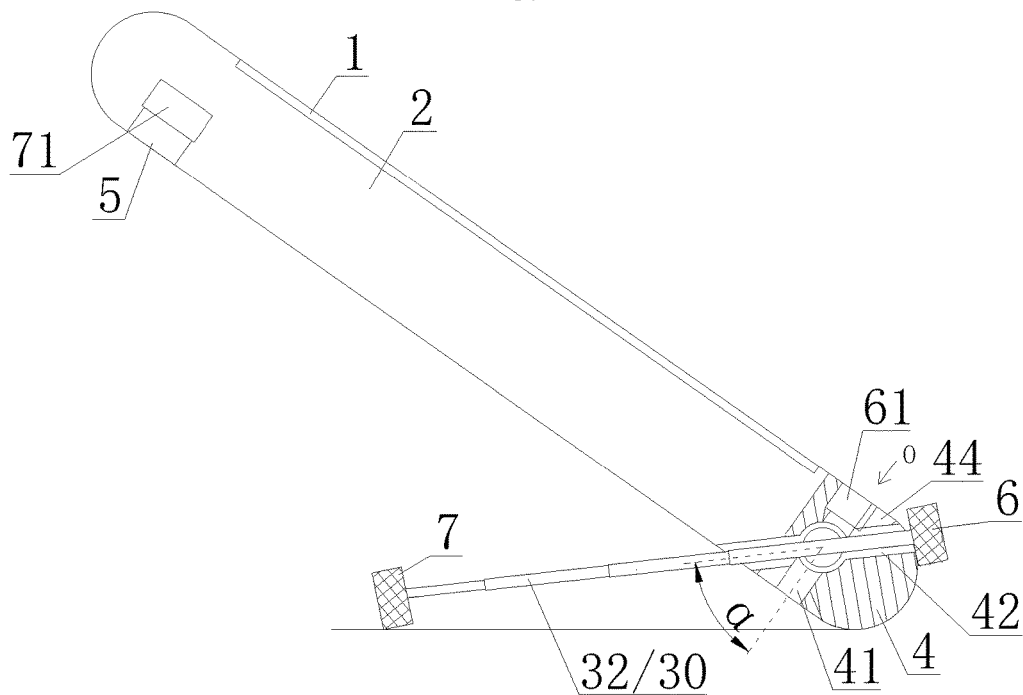
FIG. 15 illustrates a first state of another display device according to an embodiment of the present disclosure.

FIG. 15 illustrates a first state of another display device according to an embodiment of the present disclosure. As shown in FIG. 15, the first slot 40 may further include a sliding slot 44. The first through-slot 41, the sliding slot 44, and the second through-slot 42 may be interconnected to each other. Through rotating the foci 30 with the mandrel 31 as an axis, the rod 30 may be rotated from the first through-slot to the second through-slot 42 through the sliding slot 44.

In the disclosed embodiments, the first through-slot 41 and the second through-slot 42 may be interconnected with each other through the sliding slot 44, such that the rod 30 may move back and forth between the first through-slot 41 and the second through-slot 42 by rotating about an axis of the telescopic rod 32, in which the axis of the telescopic rod 32 is the rotating axis. The cross-section of the sliding slot 44 may be the shape of the plane formed by the back-and-forth rotational movement of the rod 3 between the first through-slot 41 and the second through-slot 42 with the mandrel 31 as the rotating axis.

Figure 16:
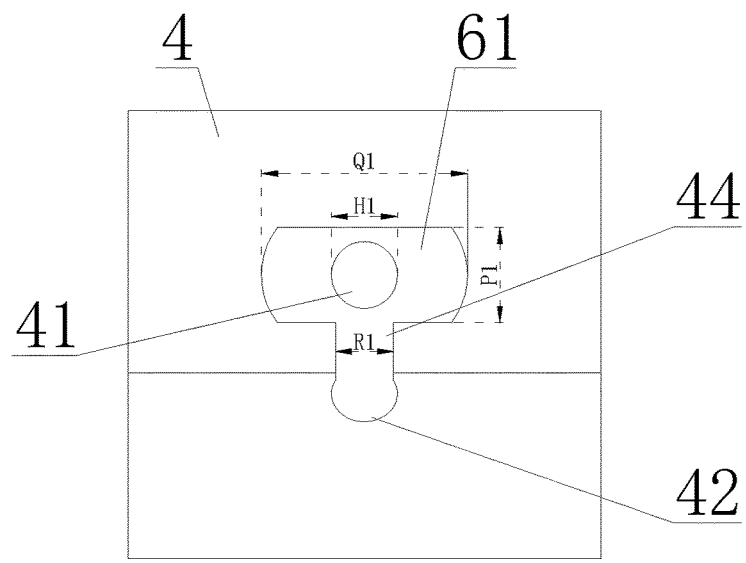
FIG. 16 illustrates a O-sectional view of a clamping portion in the display device shown in FIG. 15.
Figure 17:
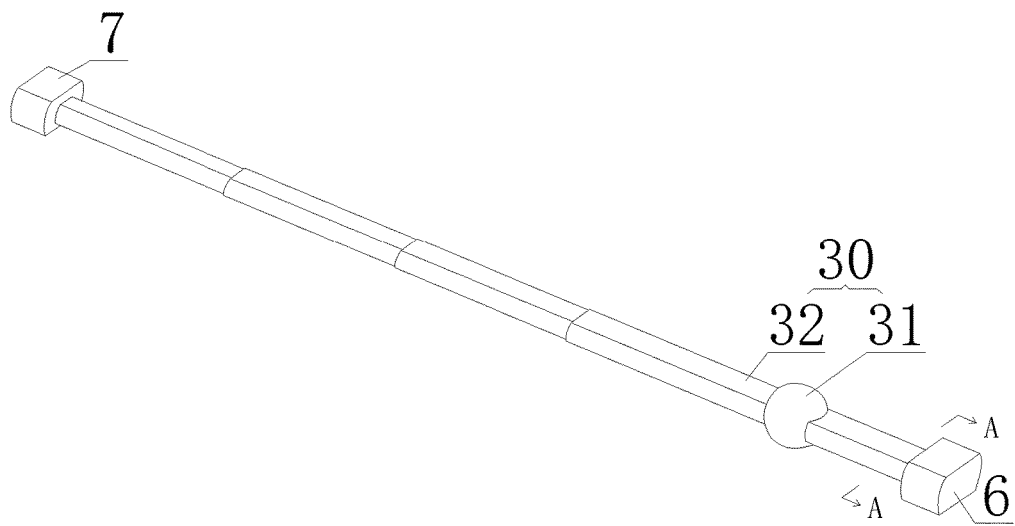
FIG. 17 illustrates a schematic three-dimensional (3D) diagram of a rod in the display device shown in FIG. 15.
Figure 18:
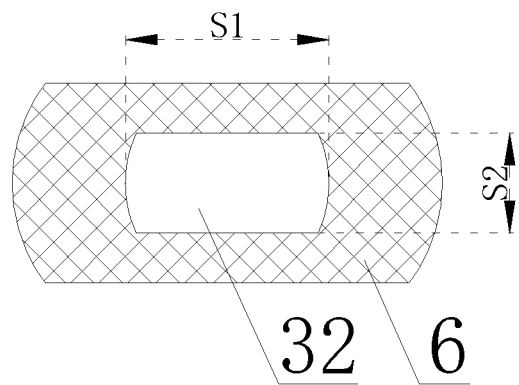
FIG. 18 illustrates an AA-sectional view of the rod in FIG. 17.

FIG. 16 illustrates a O-sectional view of a clamping portion in the display device shown in FIG. 15. FIG. 17 illustrates a schematic three-dimensional (3D) diagram of a rod in the display device shown in FIG. 15. FIG. 18 illustrates an AA-sectional view of the rod in FIG. 17.

As shown in FIGS. 16-18, in the direction perpendicular to the rotational plane of the rod 30, the thickness of the sliding slot 44 is R1, where the rotational plane may be understood as the plane in which the rod 30 is rotating back and forth between the first through-slot and the second through-slot with the mandrel 31 as the rotating axis. The length of the cross-section of the rod 30 is S1, and the width of the cross-section of the rod 30 is S2, where S2<R1<S1.

In the disclosed embodiments, when the display device is in the first state, the telescopic shaft 32 may be located in the second through-slot 42, and the first fixing portion 6 may be stuck outside the first accommodating chamber 61. The rod 30 may be rotated to configure the longitudinal direction of the first pattern to be perpendicular or parallel to the longitudinal direction of the first accommodating chamber 61, such that the second fixing portion 7 and at least one side of the display device may serve as two supporting points to support the display device on the supporting surface. When both the first fixing portion 6 and the second fixing portion 7 are located outside the display device, the rod 30 may rotate back and forth along the sliding slot 44 between the first through-slot 41 and the second through-slot 42 with the mandrel 31 as the rotating axis.

When the telescopic shaft 32 is located at the first through-slot 41, the shell 2 may be folded and the rod 30 may be rotated to configure the longitudinal direction of the first pattern to be parallel to the longitudinal direction of the first shell chamber 61, the second fixing portion 7 may be accommodated in the second accommodating chamber 71, and the telescopic shaft 32 may be contracted to enable the first fixing portion 6 to be smoothly accommodated in the first accommodating chamber 61.

In the disclosed embodiments, the first through-slot 41 and the second through-slot 42 may be interconnected through the sliding slot 44, such that the rod 30 may be able to realize the flexible switching of the display device between the first state and the second state through the reciprocating motion/back-and-forth movement within the clamping portion 4. Meanwhile, the weight of the shell 2 may be reduced without affecting the appearance of the shell 2.

In one embodiment, as shown in FIG. 15, the extending direction of the first through-slot 41 may be perpendicular to the plate surface, and an angel α may form between the extending direction of the first through-slot and the extending direction of the second through-slot 42, and 0°<α≤30°. The second through-slot 42 may have a first side close to the first fixing portion 6 and an opposing second side far away from the first fixing portion 6. The first end of the rod 30 in which the first end is provided with the first fixing portion 6 may be clamped on the first side of the second through-slot 42 (i.e., the side close to the first fixing portion 6), and the second end of the rod 30 in which the second end is provided with the second fixing portion 7 may be clamped on the second side of the second through-slot 42 (i.e., the side far away from the first fixing portion 6). Meanwhile, the second fixing portion 7 may be located outside the display device.

Then, the second fixing portion 7 and at least one side of the display device may be in contact with the supporting surface for supporting the display device. The shell 2 may have a first side facing or close to the flexible display panel 1, and a second side far away from the flexible display panel 1. An acute angle may be formed between the second side of the shell 2 (i.e., the side far away from the flexible display panel 1) and the supporting surface. The angle α may be desired to be in an appropriate range, such that when the user is operating the display device, on the one hand, the rod 30 may support the display device with the best and most stable performance; on the other hand, the users may have the best angle to view the images displayed on the display panel 1.

Figure 19:
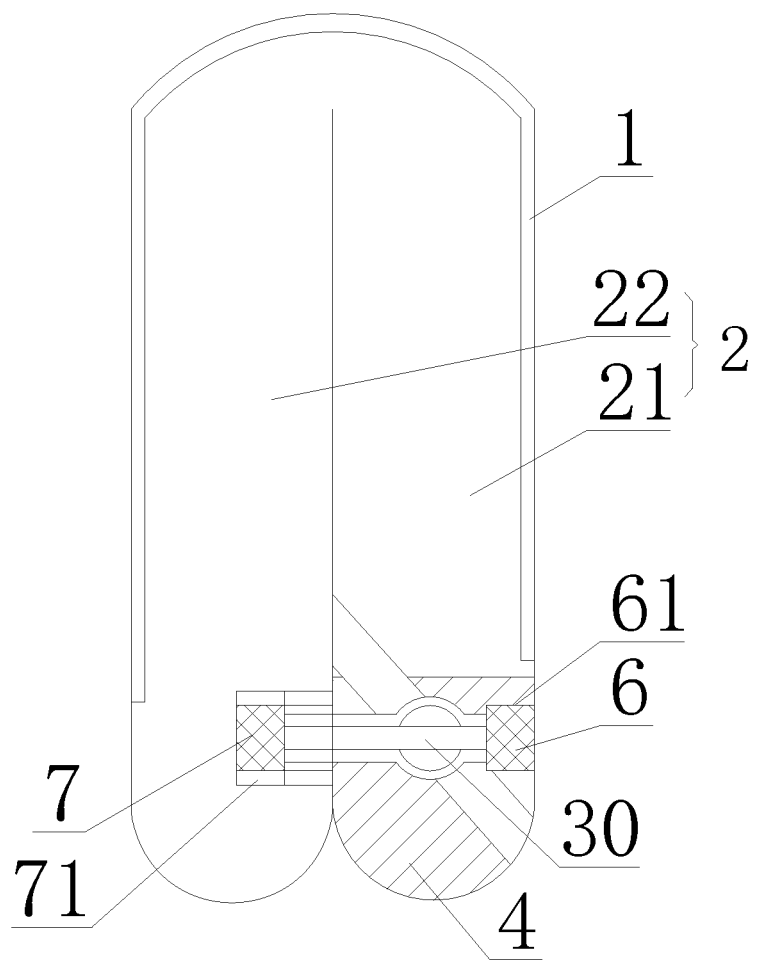
FIG. 19 illustrates a backward second state of the display device shown in FIG. 15.
Figure 20:
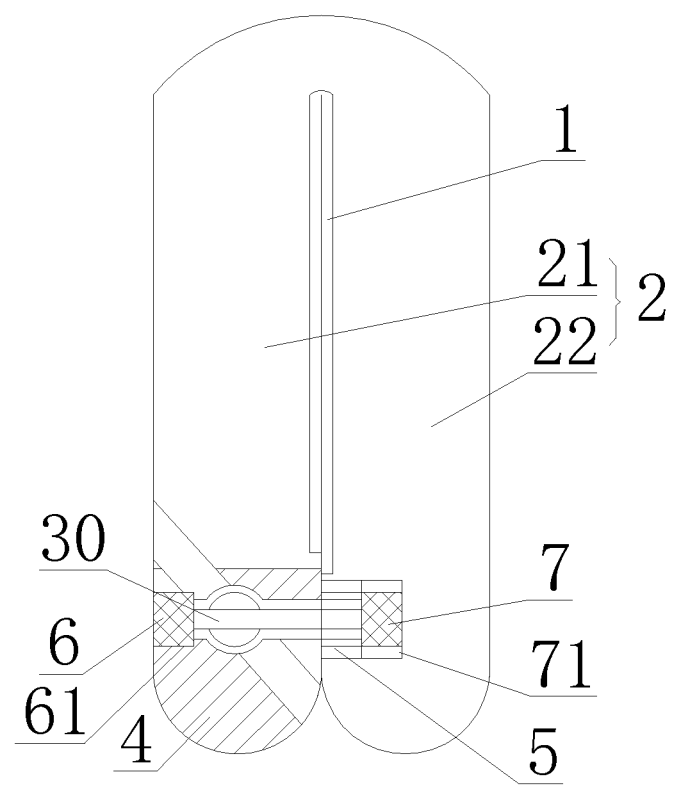
FIG. 20 illustrates a forward second state of the display device shown in FIG. 15.

FIG. 19 illustrates a backward second state of the display device shown in FIG. 15, and FIG. 20 illustrates a forward second state of the display device shown in FIG. 15.

The second state of the display device may include a forward second state and a backward second state. When the display device is in the forward second state, the display device may be folded in half by the folding line, and the flexible display panel 1 may be located between the folded shell 2. When the display device is in the backward second state, the display device may be folded in half by the folding line, and the shell 2 may be located between the folded flexible display panel 1.

As shown in FIG. 19, the display device is in the backward second state. The shell 2 and the flexible display panel 1 may be folded in half by the folding line, and the folded shell 2 may be located between the folded flexible display panel 1. The rod 30 may be rotated to configure the first fixing portion 6 at the first end of the rod 30 to be accommodated in the first accommodating chamber 61, and the second fixing portion 7 at the second end of the rod 30 to be accommodated in the second accommodating chamber 71, thereby backwardly locking the folded shell 2.

As shown in FIG. 20, the display device may be in the forward second state. The shell 2 and the flexible display panel 1 may be folded in half by the folding line, and the folded flexible display panel 1 may be located between the folded shell 2. The first accommodating chamber 61 and the second accommodating chamber 71 in the forward second state may be configured to be opposite to the first accommodating chamber 61 and the second accommodating chamber 71 in the backward second state. The plate surface for carrying the flexible display panel 1 may be designed to avoid/be away from the second slot 5. The rod 30 may be rotated to to enable the first fixing portion 6 at the first end of the rod 30 to be accommodated in the first accommodating chamber, and enable the second fixing portion 7 at the second end of the rod 30 to be accommodated in the second accommodating chamber 71, thereby forwardly locking the folded shell 2.

In one embodiment, the display device may include two rods, and the shell may include two clamping portions. The two rods may be one-to-one corresponding to the two clamping portions. For example, based on the display device in FIG. 15, two rods 30 may be configured, the two clamping portions 4 may be configured on the shell 2. The two clamping portions may have the same structure and may be one-to-one corresponding to the two rods 30, which may improve the stability of the rod 30 for supporting the display device. In another embodiment, the display device may include any appropriate number of rods and clamping portions according to various application scenarios, which is not limited by the present disclosure.

In one embodiment, the shell 2 may be a rectangle or a rounded rectangle, and the clamping portion 4 may be located at any one of the inner corners of the rectangle or the rounded rectangle.

Figure 21:
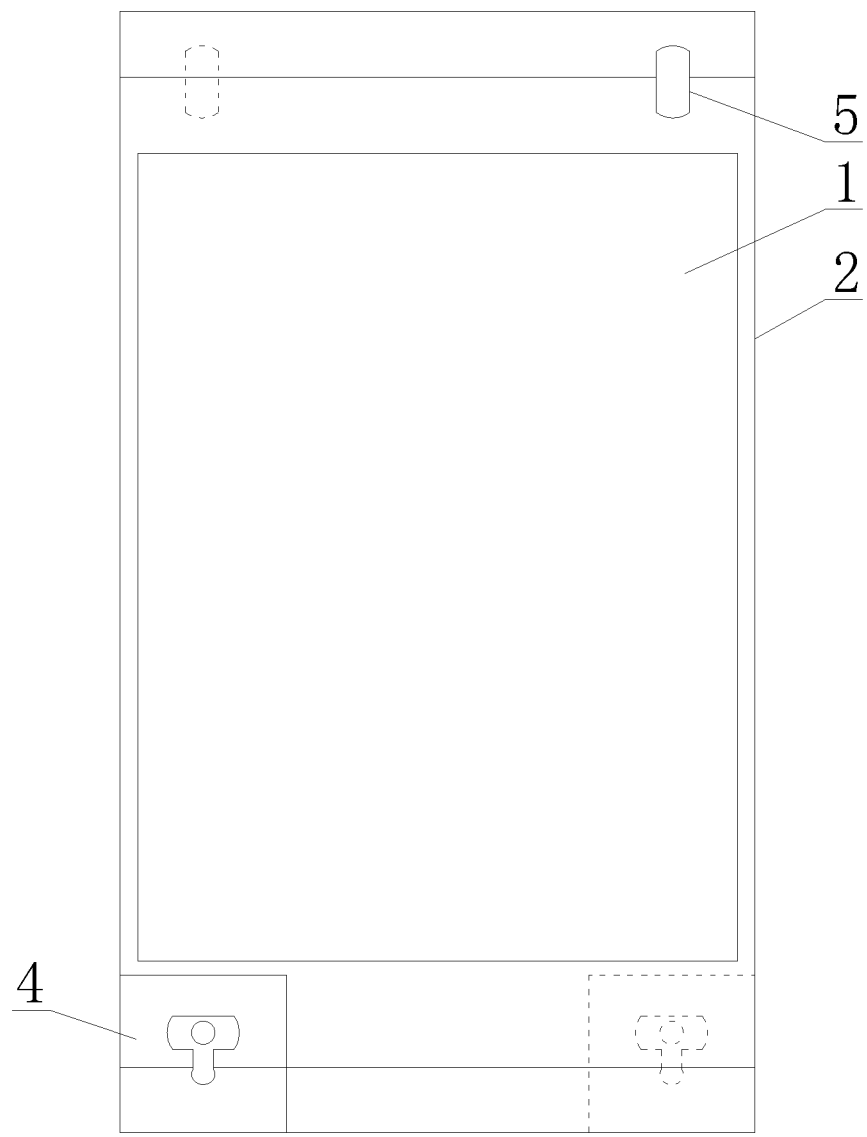
FIG. 21 illustrates a schematic top view of another display device without a rod inserted according to an embodiment of the present disclosure.

FIG. 21 illustrates a schematic top view of another display device without a rod inserted according to an embodiment of the present disclosure. As shown in FIG. 21, the shell 2 may be a rectangle and two clamping portions 4 may be respectively located at the two inner corners at the bottom of the rectangular shell 2. The two rods 30 corresponding to the clamping portions 4 may be interlinked to jointly move. The linkage may be based on a mechanical transmission method, for example, a driveshaft may connect the two rods, after one of the rods is driven, the other rod may also move. The linkage may also be based on a magnetic transmission method, for example, the two rods may be connected via a magnet, the two rods may be magnetically interlocked when the electricity is on, while not being magnetically interlocked when the electricity is off.

In one embodiment, as shown in FIG. 21, the shell 2 may include at least two locking portions: a forward locking portion and a backward locking portion. When the display device is in the forward second state, the second end of the rod 30 may be inserted into the second slot 5 of the forward locking portion, and the locking structure is shown in FIG. 20. When the display device is in the backward second state, the second end of the rod 30 may be inserted into the second slot 5 of the backward locking portion, and the locking structure is shown in FIG. 19. Thus, when the shell 2 is folded, the shell 2 may be able to be locked by the rod 30 no matter the shell 2 is folded forwardly or backwardly.

In certain embodiments, as shown in FIG. 16, FIG. 18, and FIG. 21, the first cross-section of the first accommodating chamber 61 may be a rectangle or a rounded rectangle, or the first-cross section may include two arcs opposite to each other. In particular, the first cross-section may be perpendicular to the extending direction of the first through-slot 41. When the first cross-section of the first accommodating chamber 61 is configured with two opposite arc-shaped edges, all of the first pattern of the cross-section of the first fixing portion 6, the second pattern of the cross-section of the second fixing portion 7, and the cross-section of the second slot 5 may have appropriate shapes matching the first cross-section of the first accommodating chamber 61.

In the disclosed embodiments, the display device comprises a flexible display panel; a foldable shell, wherein the foldable shell includes a plate surface for carrying the flexible display panel, a clamping portion including a first slot and a locking portion including a second slot; and a telescopic member retractable along a longitudinal direction of the telescopic member. When the display device is in a first state, the telescopic member is stretched, and an extending direction of the telescopic member intersects a plane where the plate surface is located, a first end of the telescopic member is inserted into the first slot and a second end of the telescopic member is located outside the display device as a supporting point to support the display device. When the display device is in a second state, the shell is folded in half along a folding line and divided into a first shell portion and a second shell portion by the folding line, the first shell portion and the second shell portion are at least partially overlapped with each other along a thickness direction of the first shell portion, the clamping portion is located in the first shell portion, the locking portion is located in the second shell portion, and the telescopic member is contracted, the first end of the telescopic member is inserted into the first slot and the second end of the telescopic member is inserted into the second slot.

The display device may have the following features. The telescopic member may be stretched along the longitudinal direction of the telescopic member, and the display device may be supported by the clamping portion, which may ensure the stability and buffering performance of the support and reduce the influence on the flexible display panel.

The shell may be folded forwardly or backwardly. After the shell is folded into two portions by the folding line, the telescopic member may be contracted along the longitudinal direction of the telescopic member, the first end of the telescopic member may be inserted into the first slot, and the second end of the telescopic member may be inserted into the second slot. The telescopic member may be accommodated in the slots of the shell to lock the two portions of the folded shell, such that the display device may be carried more conveniently.

Further, the folding structure may facilitate the flexible display panel to realize various display functions, thereby satisfying various demands such as personal entertainment, office work, and multi-person conferences, and providing users with multiple viewing experience.

The above detailed descriptions only illustrate certain embodiments of the disclosed disclosure and may be not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A display device, comprising:
   a flexible display panel;
   a shell capable of being folded, wherein the shell comprises a plate surface for carrying the flexible display panel, a clamping portion including a first slot, and a locking portion including a second slot; and
   a telescopic member retractable along a longitudinal direction of the telescopic member,
   wherein:
   in a first state of the display device, the telescopic member is stretched, and an extending direction of the telescopic member intersects a plane where the plate surface is located, a first end of the telescopic member is inserted into the first slot and a second end of the telescopic member is located outside the display device as a supporting point to support the display device, and
   in a second state of the display device, the shell is folded in half along a folding line and divided into a first shell portion and a second shell portion by the folding line, the first shell portion and the second shell portion are at least partially overlapped with each other along a thickness direction of the first shell portion, the clamping portion is located in the first shell portion, the locking portion is located in the second shell portion, the telescopic member is contracted, the first end of the telescopic member is inserted into the first slot, and the second end of the telescopic member is inserted into the second slot.

2. The display device according to claim 1, wherein:
after the telescopic member is stretched, the telescopic member is in a plate shape.

3. The display device according to claim 1, wherein:
the telescopic member is a rod.

4. The display device according to claim 3, wherein:
the first slot includes a first through-slot penetrating the clamping portion along a direction that intersects the plane in which the plate surface is located;
the rod is inserted into the first through-slot with two ends of the rod respectively located on two opposite sides of the shell; and
the rod moves along an extending direction of the first through-slot.

5. The display device according to claim 3, wherein:
the rod includes a mandrel and a telescopic shaft penetrating the mandrel, wherein the mandrel is a sphere;
the first slot includes a spherical groove accommodating the mandrel;
the telescopic shaft and the mandrel move relative to each other along a telescopic direction of the telescopic shaft; and
the telescopic shaft and the mandrel are interlocked in a rotational direction about an axis of the telescopic shaft in which the axis of the telescopic shaft is a rotating axis, and the telescopic shaft and the mandrel rotate around the rotating axis.

6. The display device according to claim 5, wherein:
the telescopic shaft includes at least N sub-tubes sequentially arranged as a first sub-tube to an N-th sub-tube;
an inner diameter of an X-th sub-tube is greater than an outer diameter of an (X+1)-th sub-tube; and
when the rod is contracted, the (X+1)-th sub-tube is accommodated in the X-th sub-tube, where X and N are positive integers, and $1 \leq X \leq N-1$.

7. The display device according to claim 5, wherein:
a first end of the rod includes a first fixing portion that has a cross-section perpendicular to an extending direction of the rod;
the cross-section of the first fixing portion is a first pattern with a length of L1 and a width of W1;
the clamping portion further includes a first accommodating chamber for accommodating the first fixing portion;
the first through-slot has a first end close to a surface of the shell and an opposite second end far away from the surface of the shell, and the first accommodating chamber is located at the first end of the first through-slot;
the first accommodating chamber is interconnected with the first through-slot; and
the first accommodating chamber has a length of Q1 and a width of P1, the first through-slot has a length of H1, where Q1>L1>P1>W1>H1, and Q1, P1 and H1 are dimensions in a plane parallel to the first pattern.

8. The display device according to claim 7, wherein:
in the second state of the display device, the rod is rotated to configure a longitudinal direction of the first pattern to be parallel to a longitudinal direction of the first accommodating chamber; and
the first fixing portion is pushed into the first accommodating chamber to be accommodated in the first accommodating chamber.

9. The display device according to claim 5, wherein:
a second end of the rod includes a second fixing portion that has a cross-section perpendicular to an extending direction of the rod;
the cross-section of the second fixing portion is a second pattern with a length of L2 and a width of W2;
the locking portion further includes a second accommodating chamber for accommodating the second fixing portion;
the second slot has a first end close to the clamping portion and an opposing second end far away from the clamping portion, and the second accommodating chamber is located at the second end of the second slot;
the second accommodating chamber is interconnected with the second slot;
the second slot has a length of K2 and a width of H2, where K2>L2>H2>W2; and
the second accommodating chamber has a length of Q2 and a width of P2, where Q2>L2, and P2>L2, and Q2, P2, K2 and H2 are dimensions in a plane parallel to the second pattern.

10. The display device according to claim 9, wherein:
in the second state of the display device, the rod is pushed to enable the second fixing portion to sequentially enter the second slot and the second accommodating chamber, and the second fixing portion to be accommodated in the second accommodating chamber; and
the rod is rotated to configure a longitudinal direction of the second pattern to be parallel to a width direction of the second slot.

11. The display device according to claim 7, wherein:
the first cross-section of the first accommodating chamber is a rectangle, a rounded rectangle, or includes two arc-shaped edges located opposite to each other; and
the first cross-section of the first accommodating chamber is perpendicular to an extending direction of the first through-slot.

12. The display device according to claim 4, wherein:
the first slot further includes at least one second through-slot;
the least one second through-slot penetrates the shell along a direction intersecting the plate surface;
an extending direction of the least one second through-slot intersects the extending direction of the first through-slot;
the at least one second through-slot intersects the first through-slot at the spherical groove; and
the at least one second through-slot and the first through-slot are interconnected with each other.

13. The display device according to claim 12, wherein:
in the first state of the display device, the rod is located in the at least one second through-slot; and
in the second state of the display device, the rod is located in the first through-slot.

14. The display device according to claim 12, wherein:
the first slot further includes a sliding slot, wherein the sliding slot, the first through-slot and the at least one second through-slot are interconnected with each other; and
by rotating the rod with the mandrel as an axis, the rod moves from the first through-slot to the at least one second through-slot via the sliding slot.

15. The display device according to claim 14, wherein:
in a direction perpendicular to a rotational plane of the rod, the sliding slot has a thickness of R1;
a cross-section of the rod has a length of S1 and a width of S2, where S2<R1<S1.

16. The display device according to claim 12, wherein:
the extending direction of the first through-slot is perpendicular to the plate surface; and
an angle $\alpha$ is formed between an extending direction of the at least one second through-slot and the extending direction of the first through-slot, where $0°\leq\alpha\leq30°$.

17. The display device according to claim 3, wherein:
the display device includes two rods;
the shell includes two clamping portions; and
the two rods and the two clamping portions are one-to-one correspondingly arranged.

18. The display device according to claim 1, wherein:
the shell is a rectangle or a rounded rectangle; and
the clamping portion is located at any one of inner corners of the rectangle or the rounded rectangle.

19. The display device according to claim 1, wherein:
the second state of the display device includes a forward second state and a backward second state;
in the forward second state of the display device, the display device is folded in half and the flexible display panel is positioned between the folded shell; and
in the backward second state of the display device, the display device is folded in half and the shell is positioned between the folded flexible display panel.

20. The display device according to claim 17, wherein:
the shell includes at least two locking portions: a forward locking portion and a backward locking portion;
in the forward second state of the display device, a second end of the rod is inserted into the second slot of the forward locking portion; and
in the backward second state of the display device, the second end of the rod is inserted into the second slot of the backward locking portion.

* * * * *